US009791211B2

(12) United States Patent
Harsh et al.

(10) Patent No.: US 9,791,211 B2
(45) Date of Patent: Oct. 17, 2017

(54) METHODS AND COMPOSITIONS FOR DRYING COAL

(71) Applicant: Ross Technology Corporation, Leola, PA (US)

(72) Inventors: Philip R. Harsh, Gilbertsville, PA (US); Michael F. Hurley, Lancaster, PA (US); Andrew K. Jones, Lancaster, PA (US); Vinod K. Sikka, Oak Ridge, TN (US)

(73) Assignee: Ross Technology Corporation, Leola, PA (US)

( * ) Notice: Subject to any disclaimer, the term of this patent is extended or adjusted under 35 U.S.C. 154(b) by 657 days.

(21) Appl. No.: 14/140,383

(22) Filed: Dec. 24, 2013

(65) Prior Publication Data

US 2014/0137466 A1   May 22, 2014

Related U.S. Application Data

(63) Continuation of application No. 12/942,805, filed on Nov. 9, 2010, now abandoned, which is a
(Continued)

(51) Int. Cl.
| | |
|---|---|
| *F26B 3/00* | (2006.01) |
| *F26B 3/08* | (2006.01) |
| *F26B 5/16* | (2006.01) |
| *H01L 21/78* | (2006.01) |
| *C10B 57/10* | (2006.01) |

(Continued)

(52) U.S. Cl.
CPC .............. *F26B 5/16* (2013.01); *C10B 57/10* (2013.01); *C10L 5/04* (2013.01); *C10L 5/366* (2013.01); *C10L 9/00* (2013.01); *F23K 1/00* (2013.01); *F26B 17/00* (2013.01); *H01L 21/78* (2013.01); *C10L 2230/02* (2013.01); *C10L 2290/02* (2013.01); *C10L 2290/08* (2013.01); *C10L 2290/24* (2013.01); *C10L 2290/52* (2013.01); *C10L 2290/546* (2013.01); *C10L 2290/60* (2013.01); *F23K 2201/20* (2013.01); *F23K 2201/30* (2013.01); *F23K 2201/505* (2013.01)

(58) Field of Classification Search
CPC .................................. F26B 5/16; F26B 17/00
USPC .................. 34/329, 330, 332, 333, 353, 354
See application file for complete search history.

(56) References Cited

U.S. PATENT DOCUMENTS

| | | | |
|---|---|---|---|
| 3,327,402 | A | 6/1967 | Lamb et al. |
| 3,623,223 | A | 11/1971 | Severinghaus |

(Continued)

FOREIGN PATENT DOCUMENTS

| | | |
|---|---|---|
| DE | 101 36 728 A1 | 2/2003 |
| WO | WO2010019246 | 2/2010 |

(Continued)

OTHER PUBLICATIONS

Flanigen, Edith, M., Molecular Sieve Zeolite Technology—The First Twenty-Five Years, Pure and Applied Chemistry vol. 52, pp. 2191-2211 (1980).

(Continued)

*Primary Examiner* — Kenneth Rinehart
*Assistant Examiner* — John McCormack
(74) *Attorney, Agent, or Firm* — Perkins Coie LLP

(57) ABSTRACT

The present disclosure provides methods, compositions and systems for drying coal fines.

17 Claims, 1 Drawing Sheet

Related U.S. Application Data continuation-in-part of application No. 12/924,570, filed on Sep. 30, 2010, now abandoned, and a continuation-in-part of application No. PCT/US2010/002649, filed on Sep. 30, 2010.

(60) Provisional application No. 61/247,688, filed on Oct. 1, 2009.

(51) Int. Cl.
  *F23K 1/00*  (2006.01)
  *C10L 5/04*  (2006.01)
  *F26B 17/00*  (2006.01)
  *C10L 5/36*  (2006.01)
  *C10L 9/00*  (2006.01)

(56) References Cited

U.S. PATENT DOCUMENTS

| | | |
|---|---|---|
| 4,219,519 A | 8/1980 | Goksel |
| 4,438,161 A | 3/1984 | Pollock |
| 4,690,076 A | 9/1987 | Peletz, Jr. et al. |
| 4,799,799 A | 1/1989 | Sapko et al. |
| 4,866,856 A * | 9/1989 | Feeley ............... F26B 5/005 34/340 |
| 4,892,567 A | 1/1990 | Yan |
| 5,087,269 A | 2/1992 | Cha et al. |
| 5,137,747 A | 8/1992 | Malandain et al. |
| 5,199,185 A | 4/1993 | Davidson |
| 5,298,179 A * | 3/1994 | Ukita ............... B01J 20/28004 252/62.53 |
| 5,384,343 A | 1/1995 | Farrar et al. |
| 5,403,365 A | 4/1995 | Merriam et al. |
| 5,577,333 A | 11/1996 | Shick et al. |
| 5,815,946 A | 10/1998 | Dean |
| 6,572,040 B1 | 6/2003 | Brown, Jr. |
| 6,986,213 B2 * | 1/2006 | Kruithof ............... F26B 5/16 34/330 |
| 2007/0151147 A1 | 7/2007 | Learey et al. |
| 2009/0165361 A1 | 7/2009 | Rappas et al. |
| 2010/0176226 A1 | 7/2010 | Avant, Jr. et al. |
| 2011/0078917 A1 | 4/2011 | Bland et al. |
| 2011/0179695 A1 | 7/2011 | Harsh et al. |
| 2011/0247233 A1 | 10/2011 | Bland et al. |
| 2011/0252662 A1 | 10/2011 | Bland et al. |

FOREIGN PATENT DOCUMENTS

| | | |
|---|---|---|
| WO | WO2011040965 A2 | 2/2010 |
| WO | WO2011040965 A3 | 7/2011 |

OTHER PUBLICATIONS

Jameson, Cell for Retreating Coal Tailings, Queensland Mining and Energy Bulletin, Summer 2010/11,
U.S. Appl. No. 12/924,570.
U.S. Appl. No. 13/168,169.
U.S. Appl. No. 13/168,186.

* cited by examiner

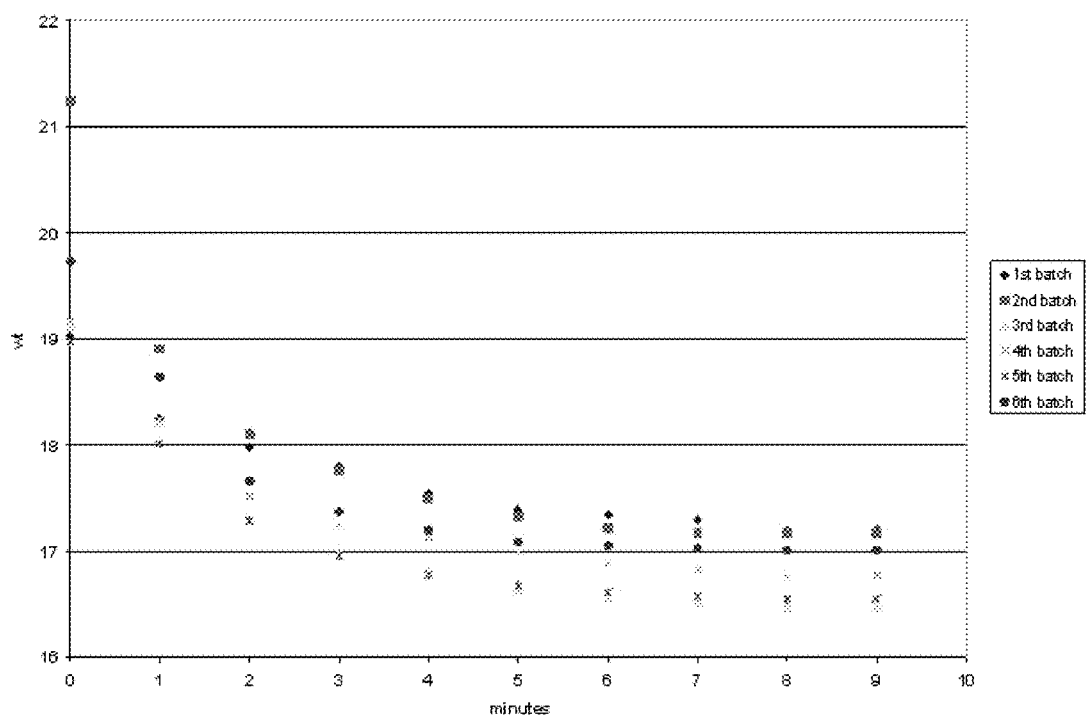
Graph of Drying of Molecular Sieves after they have removed moisture from coal fines

METHODS AND COMPOSITIONS FOR DRYING COAL

This application is a continuation of U.S. application Ser. No. 12/942,805 , entitled METHODS AND COMPOSITIONS FOR DRYING COAL, filed Nov. 9, 2010, which is a continuation-in-part of U.S. application Ser. No. 12/924,570, entitled COAL FINE DRYING METHOD AND SYSTEM, filed Sep. 30, 2010, which claims the benefit of U.S. Provisional Patent Application No. 61/247,688, entitled METHOD OF DRYING COAL FINES, filed Oct. 1, 2009; said U.S. application Ser. No. 12/942,805 is also a continuation-in-part of International Application No. PCT/US10/02649, entitled COAL FINE DRYING METHOD AND SYSTEM, filed Sep. 30, 2010, which claims the benefit of U.S. Provisional Patent Application No. 61/247,688, the contents of each of which are incorporated by reference in their entireties.

BACKGROUND

Many current methods of coal mining use water to extract fine coal particles (also called coal fines). Such particles typically can have with diameters from approximately 100 to 800 microns in diameter, although coal fines may have smaller diameters, e.g., on the order of 50 microns or less. Traditional methods of drying the coal particles, including centrifugation and heating technologies, can readily dry these coal "fines" to approximately 30% moisture. Methods of drying coal fines beyond this point typically employ blowers and heaters which require capital intensive investment, require substantial energy use, and create environmental problems and hazards both from energy use and from aerosolization of the coal fines.

SUMMARY

Embodiments of this disclosure provide methods and compositions for drying wet coal fines by employing water-collecting materials such as molecular sieves, water adsorbing polymeric agents, desiccants, and the like that are easily separated from the coal fines, for example by sieving or sifting. Such materials may remove all or a portion of the water from the wet fines by physical and/or chemical action. For example, the water-collecting materials may draw water from the wet fines by sorption, e.g., absorption or adsorption. In embodiments of the methods and compositions herein, the materials used for collecting water from the coal fines can be recycled and/or reused to dry more coal fines after removing some or all of the water from the water-collecting materials.

BRIEF DESCRIPTION OF THE DRAWING

FIG. 1 shows the weight of a batch of molecular sieves used to adsorb water from six batches of coal fines. The weight of the molecular sieves are determined after drying each batch of coal fines and at the indicated time throughout the drying process weighed periodically

DETAILED DESCRIPTION

Embodiments described herein utilize water-collecting materials such as adsorbents and absorbents that can collect moisture from wet coal fines. Advantageously, such materials can efficiently collect the moisture from the coal fines, and then can be separated from the fines, so as to reduce the amount of water associated with the coal fines. In some embodiments, the water-collecting materials then can be dried separately from the coal fines. The process may provide one or more desirable benefits such as a reduction in one or more of time, energy, cost, and/or adverse environmental impact, as compared to other processes of drying wet coal fines. Moreover, embodiments of this disclosure can substantially reduce the aerosolization of coal fines by blowers, which can pose health, fire and explosion hazards.

Although embodiments described herein do not require the drying and reuse of such water-collecting materials, many such materials can be efficiently dried separately from the coal fines and reused one or more times. Embodiments described herein thus employ the drying and reuse water-collecting materials such as absorbents and adsorbents. In other embodiments all or a portion of the water-collecting material can be discarded, e.g., where an absorbent is degraded and cannot be effectively separated from the coal fines. In one embodiment, particles of water-collecting materials are separated by sieving or sifting to remove degraded particles which may be larger than particles of coal fine, but are smaller than desirable for processing wet coal fines. In other embodiments, some or all of the absorbent materials employed for use in removing moisture from coal fines may be biodegradable.

The water-collecting material also may bond with the water to cause the water to be associated with the material instead of the coal fines.

1.0 Removing Moisture from Coal Fines Coal fines may separated from the bulk water (water in excess of that which is associated with coal fines when they settle, or are filtered or centrifuged out aqueous suspension) used in the mining/recovery process by any one or more of a variety of known techniques. Such techniques include, but are not limited to one or more of, filtration (e.g., gravity based filtration, or filtration assisted by centrifugal force, pressure or vacuum), settling, centrifugation and the like, which can used singly or in combination. Further amounts of water may optionally be removed from the coal fines by a second round of such treatments.

After one or more separation steps to removal bulk water, the wet coal fines are then mixed with particles of a water-collecting material or combination of different types of water-collecting materials, e.g., particles of absorbent or adsorbent, to further reduce the amount of water associated with the fines. In one embodiment, the particles of water-collecting material are large enough to be separated from the coal fines by size (e.g., sifting with an appropriate size screen or mesh). In various embodiments, to facilitate their drying, the wet coal fines are mixed with one or more types of water-collecting materials including, but not limited to, molecular sieves, particles of hydratable polymers (e.g., polyacrylate or carboxymethyl cellulose/polyester particles), or desiccants (e.g., silicates). The rate at which various water-collecting materials adsorb, absorb, or react with water present in coal fines may be affected by temperature. Each type of water-collecting material may have different optimum temperatures for the rate at which they will accumulate water from the coal fines. In some instances, as with molecular sieves, heating/warming the molecular sieves with the coal fines, or heating/warming molecular sieves immediately prior to mixing them with coal fines, may increase the rate at which water becomes associated with the molecular sieves. In other embodiments, materials such as alumina particles may accumulate water at suitable rate from coal fines at room temperature (e.g., about 20-25° C.). Water-collecting materials containing water formerly associated with the coal fines can subsequently be removed from the coal fines a variety of means.

1.1 The Use of Molecular Sieves as Adsorbents to Reduce the Moisture Content of Coal Fines Molecular sieves are materials containing pores of a precise and uniform size (pore sizes are typically from about 3 to about 10 Angstroms) that are used as an adsorbent for gases and liquids. Without wishing to be bound by any theory, generally molecules small enough to pass through the pores are adsorbed while larger molecules cannot enter the pores. Molecular sieves are different from a common filter in that they operate on a molecular level. For instance, a water molecule may not be small enough to pass through while the smaller molecules in the gas pass through. Because of this, they often function as a desiccant. Some molecular sieves can adsorb water up to 22% of their dry weight. Molecular sieves often they consist of aluminosilicate minerals, clays, porous glasses, microporous charcoals, zeolites, active carbons (activated charcoal or activated carbon), or synthetic compounds that have open structures through or into which small molecules, such as nitrogen and water can diffuse. In some embodiments, the molecular sieves are an aluminosilicate mineral (e.g., andalusite, kyanite, sillimanite, or mullite). In other embodiments, the molecular sieves comprise about 10%, 20%, 30%, 40%, 50%, 60%, 65%, 70%, 75%, 80%, 85%, 90%, 95%, 98%, 99% or greater (on a weigh basis) of an aluminosilicate mineral. In some embodiments, including those embodiments where the molecular sieves comprise an aluminosilicate mineral, the particles of molecular sieves may contain other minerals, such oxides of zirconium or titanium to enhance properties such as strength and wear (e.g., zirconia toughened aluminosilicates or alumina-titanate-mullite composites). In some embodiments the molecular sieves are 3 angstrom molecular sieves (e.g., MS3A4825 molecular sieves with 2.5-4.5 mm bead size and 14 lb crush strength from Delta Enterprises, Roselle, Ill.) or 4 angstrom molecular sieves (e.g., MS4A4810 molecular sieves with 2.5-4.5 mm bead size and 18 lb crush strength from Delta Enterprises, Roselle, Ill.).

A variety of molecular sieves can be employed alone or in combination to remove water or moisture from coal fines. In one embodiment, molecular sieves may be selected from aluminosilicate minerals, clays, porous glasses, microporous charcoals, zeolites, active carbons, or synthetic compounds that have open structures through or into which small molecules, such as nitrogen and water can diffuse. In other embodiments, molecular sieves may be selected from aluminosilicate minerals, clays, porous glasses, or zeolites.

Molecular sieves with pores large enough to draw in water molecules, but small enough to prevent any of the coal fines from entering the sieve particles, can be advantageously employed. Hardened molecular sieves or molecular sieves, or those with an especially hard shell, are useful in the methods described herein as such sieves will not be readily worn down and can be reused after removal of moisture.

In some embodiments molecular sieve particles are greater than 1, 1.25, 1.5, 1.75, 2.0, 2.25 or 2.5 mm in diameter and less than about 5 mm or 10 mm. In other embodiments the molecular sieve particles are greater than about 12, 14, 16, 18, 20, 22, 24 or 26 mm in diameter and less than about 28, 30 or 32 mm in diameter. When mixed with the wet coal fines having excess moisture (wet coal fines), the molecular sieves quickly draw the moisture from the coal fines. As the sieves are larger than the coal fines (e.g., over a millimeter in diameter), the mixture of sieves and coal fines can be lightly bounced on a fine mesh grid, where the dry coal fines can be separated from the molecular sieves. The separated molecular sieves can be a bit dusty and can carry a minute amount of coal fines with them after they have absorbed the water. Once separated, the molecular sieves can be passed to a heater where they can be dried and sufficient moisture is removed to permit their reuse if desired. Thus, the molecular sieves can be employed in a close-loop system, where they are mixed with the coal fines, and after removing water/moisture (drying) they are separated from the coal fines and passed through a heater and reused. Minimal agitation is required during dry the sieves.

1.2 The Use of Hydratable Polymeric Materials to Reduce the Moisture Content of Coal Fines Hydratable polymeric materials or compositions comprising one or more hydratable polymers may be employed to reduce the moisture content of coal fines (e.g., polyacrylate or carboxymethyl cellulose/polyester particles/beads).

In one embodiment the hydratable polymeric materials is polyacrylate (e.g., a sodium salt of polyacrylic acid). Polyacrylate polymers are the superabsorbents employed in a variety of commercial products such as in baby's diapers, because of their ability to absorb up to 400% of their weight in water. Polyacrylates can be purchased as a come a translucent gel or in a snowy white particulate form. Suitable amounts of polyacrylic acid polymers (polyacrylates) sufficient to adsorb the desired amounts of water from coal fines can be mixed with the fines, to quickly dry coal. The polyacrylate, which swells into particles or "balls," may be separated from the coal fines on suitable size filters or sieves. The particles or "balls" can either be discarded or recycled by drying using any suitable method (direct heating, heating by exposure to microwave energy, and the like).

The properties of hydrateable polymers, including polyacrylate polymers, may be varied depending on the specifics of the process being employed to dry the coal fines. A skilled artisan will recognize that the properties (gel strength, ability to absorb water, biodegradability etc.) are controlled to a large degree by the type and extent of the cross-linking that is employed in the preparation of hydratable polymers. A skilled artisan will also recognize that it may be desirable to match the degree of cross-linking with the mechanical vigor of the process being used dry the coal fines and the number of times, if any, that the particles are intended to be reused in drying batches of coal fines. Typically, the use of more cross-linked polymers, which are typically mechanically more stable/rigid, will permit their use in more mechanically vigorous processes and the potential reuse of the particles.

In another embodiment the hydratable polymer composition employed is a combination of carboxymethylcellulose (CMC) and polyester (e.g., CMC gum available from Texas Terra Ceramic Supply, Mount Vernon, Tex.). Such compositions, or other super adsorbent hydratable polymeric substances, can be used to remove water from coal fines in a manner similar to that described above for molecular sieves or polyacrylate polymer compositions.

1.3 The Use of Desiccants to Reduce the Moisture Content of Coal Fines

In other embodiments, desiccants are used as water-collecting materials to dry coal fines. A variety of desiccation agents (desiccants) may be employed to reduce the moisture content of coal fines including, but not limited to, silica, alumina, and calcium sulfate (Drierite, W.A. Hammond Drierite Col Ltd Xenia, Ohio) and similar materials. Desiccants, like the compositions described above can be used to remove water from coal fines in a manner similar to that described above for molecular sieves or polyacrylate polymer compositions.

In some embodiments, the desiccant material is comprised of activated alumina, a material that is effective in absorbing water. Without wishing to be bound by any theory, activated alumina's efficiency as a desiccant is based on the large and highly hydrophilic surface area of activated alumina (on the order of 200 $m^2/g$) and water's attraction (binding) to the activated alumina surface. Other materials having high-surface areas that are hydrophilic are contemplated, e.g., materials that have hydrophilic surfaces and surface areas greater than 50 $m^2/g$, 100 $m^2/g$ or 150 $m^2/g$. In some embodiments the desiccant comprises about 10%, 20%, 30%, 40%, 50%, 60%, 65%,70%, 75%, 80%, 85%, 90%, 95%, 98%, 99% or greater (on a weigh basis) of alumina.

Activated alumina is a very hard, durable ceramic capable of withstanding significant abrasion and wear, however, the wear resistance and mechanical properties of activated alumina may be enhanced by introducing other materials into particles of water-collecting materials that comprise alumina. In some embodiments, desiccants comprising alumina may contain about 0.5%, 1%, 2%, 3%, 4%, 5%, 6%, 7%, 8%, 9%, 10%, 15%, 20%, 25%, 30%, 40%, 50%, 60%, 70%, 80%, or 90% or more of other minerals, such oxides of zirconium or titanium to enhance properties such as strength and wear (e.g., zirconia alumina or zirconia toughened alumina ZTA).

1.4 Particles of Water Collecting Materials

As described above, a variety of water-collecting materials may be employed in systems for removing water from wet (or moist) coal fines. Such water-collecting materials include those that absorb water, those that adsorbs water, and those that bonds or react with water. Typically the water-collecting materials will be in the form of particles that can be of any shape suitable for forming an admixture with the wet (or moist) coal fines and that are capable of being recovered. Such particles may be irregular in shape, or have a regular shape. Where particles are not irregular in shape they may be of virtually any shape. In one embodiment, particles that are generally or substantially spherical, or generally or substantially oblate, or prolate may be employed. Suitable particle shapes also include cylindrical or conical particles, in addition to regular polygons such as icosahedral particles, cubic particles and the like. During use and reuse the particles may become abraded altering their shape.

Particles for use in the methods and systems for removing water (e.g., reducing the moisture content) of from coal fines described herein can be of a variety of sizes. In one embodiment, where the water-collecting materials are in the form of particles, the particles have an average size that is at least: 2, 3, 4, 6, 7, 8; 9, 10, 12, 14, 16, 18, 20, 25, or 30 times greater than the average size of the coal fines, which are typically in the range of 100 to 800 microns. In one embodiment the difference in size is based upon the difference in the average size of the largest dimension of the particles and coal fines.

Particles of water-collecting materials, including those that are spherical or substantially spherical, may have an average diameter (or largest dimension) that is at least: 1, at least 1.25, at least 1.5, at least 1.75, at least 2.0, at least 2.25, at least 2.5 mm, or at least 4 mm where the average diameter (or largest dimension) is less than about 5 mm, 7.5 mm, 10 mm or 15 mm. In another embodiment, the systems may employ particles that have an average diameter (or largest dimension) that is greater than about 4, 5, 6, 8, 10, 12, 14, 16, 18, 20, 22, 24 or 26 mm and less than about 28, 30 or 32 mm.

In embodiments where particles have an irregular shape, or are not spherical or substantially spherical, they may have a largest dimension that is at least: 1, at least 1.25, at least 1.5, at least 1.75, at least 2.0, at least 2.25, at least 2.5 mm, or at least 4 mm, and less than about 5 mm, 7.5 mm, 10 mm or 15 mm. In another embodiment, the methods and systems described herein may employ irregular or non-spherical particles that have a largest dimension that is greater than about one of 4, 5, 6, 8, 10, 12, 14, 16, 18, 20, 22, 24 or 26 mm and less than about one of 28, 30 or 32 mm.

In one embodiment the water-collecting materials are desiccants, such as activated alumina desiccants, which are manufactured in multiple forms. In some embodiments the desiccants particles used for water-collecting materials, which may be spherical or substantially spherical, are greater than about 1, 1.25, 1.5, 1.75, 2.0, 2.25 or 2.5 mm in diameter and less than about 5 mm or 10 mm in diameter. In other embodiments the desiccant particles have an average diameter or greatest dimension that is greater than about 4, 5, 6, 8, 10, 12, 14, 16, 18, 20, 22, 24 or 26 mm in and less than about 28, 30 or 32 mm. In one set of embodiments the desiccant particles are spheres (or substantially spherical) with diameters (e.g., average diameters) in those size ranges. In other embodiments, the desiccant particles are spheres (or substantially spherical) in sizes up to or about 6 mm in diameter. In other embodiments the desiccants are spherical or substantially spherical particles comprised of alumina having a size in a range selected from: about 2 mm to about 4 mm, about 4 mm to about 8 mm, about 8 mm to about 16 mm, about 16 mm to about 32 mm, about 5 mm to about 10 mm, about 8 mm to about 20 mm, and about 16 mm to about 26 mm. In still other embodiments, the water collecting materials are spherical or substantially spherical alumina particles having an average diameter of about: 4, 6, 8, 10, 12, 14, 16, 18, 20, 22, 24, 26, 28, 30, or 32 mm.

2.0 Separation by Size and/or Magnetic Means

Water-collecting materials may be separated from coal fines by any suitable technique including filtering, sieving or sifting, or the use of a stream of gas to carry coal fines away from larger and/or heavier particles water-collecting materials.

The separation of all types of water-collecting materials (e.g., molecular sieves, desiccants, or hydratable polymers) may also be accomplished using magnetic separation equipment where the water-collecting materials comprise material capable of, or susceptible to, being attracted by a magnet. Materials that render water-collecting materials capable of being attracted by a magnet include magnetic material and ferromagnetic material (e.g., iron, steel, or neodymium-iron-boron). Water-collecting materials need only comprise sufficient magnetic materials to permit their separation from coal fines. The amount of magnetic material employed permit the separation of water-collecting particles from coal fines will vary depending on, among other things, the strength of the magnet, the size of the particles, and the depth of the bed of coal fines from which the particles are to be collected. The amount of magnetic material may be greater than about 10%, 20%, 30%, 40%, 50%, 60%, 65%, 70%, 75%, 80%, 85%, or 90% of the total weight of the water-collecting material on a dry weight basis. In some embodiments the magnetic materials will be iron or an iron containing material such as steel.

Regardless of the magnetic material employed to render water-collecting materials susceptible to magnetic collection, the magnetic materials may be arranged in the water-collecting material as a solid core or as dispersed particles or layers within the water-collecting materials. Where dispersed particles employed are employed, they may be spread uniformly throughout the water-collecting material. In one embodiment the magnetic material is comprises iron containing particles that are admixed with water-collecting materials such as alumina or mullite prior to forming into pellets that will fired into a ceramic type of material. In still other embodiments the water-collecting materials may contain layers of materials that render the particles susceptible to attraction by a magnet (e.g. iron or steel). Examples of magnetic alumina particles that may be used as water-collecting materials may be found in U.S. Pat. No. 4,438,161 issued to Pollock titled Iron-containing refractory balls for retorting oil shale.

3.0 Separation Systems and Methods

The present disclosure also includes and provides for systems and methods for removing water from wet coal fines. The systems and methods described herein may employ any of the above-described water-collection materials or particles of water collecting materials for removing water from coal fines. As described above the water-collecting materials may comprise molecular sieve, a hydratable polymers or desiccants. And as also described above, regardless of the type, size and shape of particles of water-collecting material, the particles also may include materials that render the particles susceptible to attraction by a magnet to facilitate magnetic separation of the particles from coal fines.

In one embodiment such systems and methods comprise:

a first location in which the wet coal fines are admixed with at least one water-collecting material to form an admixture of wet coal fines and said water-collecting material, and a second location where at least a portion of said water-collecting material is removed from said admixture.

In one embodiment the second location is configured to provide size-based separation. In another embodiment, the second location is configured to provide a treatment selected from the group consisting of filtering, sieving or sifting, and the use of a stream of gas to carry coal fines away from larger and/or heavier water-collecting materials.

The second location may also be configured to provide magnetic separation of water-collecting materials from the coal fines. Magnetic separation may be employed alone or in combination with any one or more of filtering, sieving or sifting, and the use of a stream of gas to separate coal fines from particles of water-collecting materials.

Systems and methods for collecting water from coal fines may further comprise a third location where at least a portion of the water is removed from the water-collecting material. In addition, the systems may further comprising a transporter for transporting at least a portion of the water-collecting material obtained from the third location back to the first location for admixture with wet coal fines. Where particles having materials that are susceptible to attraction by a magnetic are used, such transport systems also may include magnetic transport equipment.

In one embodiment, following the step of forming an admixture of the coal fines with the water-collecting material, at least 25% of the water (by weight) in the composition is associated with the water-collecting material. In other embodiments, the amount of water by weight that is associated with the water-collecting material is at least 30%, at least 35%, at least 40%, at least 45%, at least 50%, at least 55%, at least 60%, at least 65%, at least 70%, at least 75%, at least 80%, at least 85%, or at least 90%.

EXAMPLE 1

Coal fines (15 g) with a moisture content of 30% by weight are mixed with molecular sieves having a pore sizes of 3 angstroms (15 g, product MS3A4825 2.5-4.5 mm bead size from Delta Adsorbents, which is a division of Delta Enterprises, Inc., Roselle, Ill.) for about 60 minutes thereby drying the coal fines to <5% moisture by weight. After separating the coal fines from the sieves by sifting, the molecular sieves were weighed and dried in a 100° C. oven. The coal fines were weighed periodically to determine the length of time necessary to drive off the water absorbed from the coal. The data is plotted in FIG. 1 for the first batch of coal. The process is repeated using the same molecular sieves with a second through sixth batch of coal fines. The graph in FIG. 1 shows the weight measurements for the molecular sieves throughout the drying process after drying the first through sixth batches of coal fines. FIG. 1 demonstrates that the molecular sieves can be effectively reused.

EXAMPLE 2

Coal fines (15 g) with a moisture content of 30% by weight are mixed with a polyacrylate polymer (0.5 g Online Science Mall, Birmingham, Ala.) for about 1 minute thereby drying the coal fines to <5% moisture by weight. After separating the coal fines from the polymer gently sifting the mix, the molecular polyacrylate polymer particles are recovered for reuse after drying.

EXAMPLE 3

Coal fines (100 g) with a moisture content of 21% by weight are mixed with activated alumina beads (6mm diameter, AGM Container Controls, Inc, Tucson, Ariz.) for about 10 minutes, thereby drying the coal fines to about 7% moisture by weight. After separating the coal fines from the polymer gently sifting the mix, the activated alumina beads are recovered for reuse after drying.

The invention(s) as defined by the appended claims is/are not to be limited in scope by the embodiments disclosed herein. Indeed, various modifications of the embodiments shown and described herein will become apparent to those skilled in the art from the foregoing description and thus should be deemed to fall within the scope of the appended claims.

The invention claimed is:

1. A method of reducing the water associated with wet coal fines comprising:
   (a) contacting said wet coal fines with at least one water-collecting material;
   (b) collecting at least a portion of the water present in the wet coal fines with the water-collecting material, wherein said water-collecting material comprises a desiccant selected from the group consisting of alumina and calcium sulfate;
   (c) separating the particles of water-collecting material that contacted said wet coal fines;
   (d) removing at least a portion of the water from a portion of said water-collecting material that contacted said wet coal fines by drying; and
   (e) recycling at least a portion of the separated and dried water-collecting material from step (d) to step (a), thereby reusing the water-collecting material in a loop system.

2. The method according to claim 1, wherein said water-collecting material collects water by absorption and/or adsorption.

3. The method according to claim 1, wherein, prior to the step of contacting said wet coal fines with said water-collecting material, the coal fines are in a mixture comprising water that is subjected to an earlier treatment for removing water.

4. The method according to claim 3, wherein said earlier treatment is carried out by one or more treatments selected from the group consisting of treatment with air or another gas, filtration, settling, and centrifugation.

5. The method according to claim 1, wherein said water-collecting material is in the form of particles, wherein said particles have an average diameter that is greater than about mm and wherein said average diameter is less than about 32 mm.

6. The method according to claim 1, wherein said drying is carried out using a heater.

7. The method according to claim 1, wherein said separating step comprises size-based separation.

8. The method according to claim 1, wherein, following the collection of water by the water-collecting material, the amount of water associated with the coal fines by weight is selected from the group consisting of less than about 10%, less than about 8%, less than about 6%, less than about 5% and less than about 4%.

9. A system for removing water from wet coal fines comprising:
   (a) a first location in which the wet coal fines are admixed with at least one water-collecting material to form an admixture of wet coal fines and said water-collecting material, wherein said water-collecting material comprises a desiccant selected from the group consisting of alumina and calcium sulfate;
   (b) a second location where at least a portion of said water-collecting material is removed from said admixture;
   (c) a third location wherein the portion of said water-collecting material removed from said admixture is dried; and
   (d) a transporter for transporting at least a portion of the water-collecting material obtained from the third location to be recycled back to the first location for admixture with said wet coal fines, thereby reusing the dried water-collecting material.

10. The system according to claim 9, wherein, following the step of forming said admixture, at least 25% of the water (by weight) in the composition is associated with the water-collecting material.

11. The system according to claim 10, wherein the amount of water by weight that is associated with the water-collecting material is at least 35%.

12. The system according to claim 9, wherein said water-collecting material comprises alumina.

13. The system according to claim 9, wherein said water-collecting material is in the form of particles.

14. The system according to claim 13, wherein said particles have an average diameter that is greater than about mm and wherein the average diameter is less than about 32 mm.

15. The system according to claim 9, wherein said second location is configured to provide size-based separation of said water-collecting material from said coal fines.

16. A system according to claim 9, wherein said removed water-collecting material that formed an admixture of said wet coal fines is dried using a heater.

17. A system according to claim 9, wherein said dried water-collecting material is recycled in a loop system.

* * * * *